(12) United States Patent
Miao et al.

(10) Patent No.: US 6,571,628 B1
(45) Date of Patent: Jun. 3, 2003

(54) Z-AXIS ACCELEROMETER

(75) Inventors: Yubo Miao, Singapore (SG); Ranganathan Nagarajan, Singapore (SG); Uppili Sridhar, Singapore (SG); Rakesh Kumar, Singapore (SG); Zhang Qingxin, Singapore (SG)

(73) Assignee: Institute of Microelectronics, Singapore (SG)

( * ) Notice: Subject to any disclaimer, the term of this patent is extended or adjusted under 35 U.S.C. 154(b) by 173 days.

(21) Appl. No.: 09/687,161

(22) Filed: Oct. 16, 2000

(51) Int. Cl.[7] ........................... G01P 15/00; H04R 31/00
(52) U.S. Cl. .................. 73/488; 73/514.02; 73/514.16; 29/594
(58) Field of Search .............................. 73/488, 514.01, 73/514.16, 514.32, 493; 29/592, 593, 594

(56) References Cited

U.S. PATENT DOCUMENTS

| | | | | |
|---|---|---|---|---|
| 3,733,661 A | * | 5/1973 | Zieringer | 29/593 |
| 3,748,727 A | * | 7/1973 | Swain | 29/592.1 |
| 4,776,924 A | | 10/1988 | Delapierre | 156/647 |
| 4,872,342 A | * | 10/1989 | Hanson et al. | 73/514.29 |
| 4,999,735 A | * | 3/1991 | Wilner | 361/283 |
| 5,317,919 A | * | 6/1994 | Awtrey | 73/718 |
| 5,337,606 A | * | 8/1994 | Bennett et al. | 73/514.32 |
| 5,576,250 A | | 11/1996 | Diem et al. | 437/228 |
| 5,628,100 A | * | 5/1997 | Johnson et al. | 29/25.41 |
| 5,723,790 A | | 3/1998 | Andersson | 73/514.36 |
| 5,770,465 A | | 6/1998 | MacDonald et al. | 437/67 |
| 5,830,777 A | | 11/1998 | Ishida et al. | 438/50 |
| 6,013,311 A | * | 1/2000 | Chatterjee et al. | 427/100 |
| 6,035,714 A | * | 3/2000 | Yazdi et al. | 73/514.32 |
| 6,167,757 B1 | * | 1/2001 | Yazdi et al. | 73/514.32 |
| 6,286,369 B1 | * | 9/2001 | Yazdi et al. | 73/514.32 |
| 6,402,968 B1 | * | 6/2002 | Yazdi et al. | 216/2 |

* cited by examiner

Primary Examiner—Helen Kwok
Assistant Examiner—Jacques Saint-Surin
(74) Attorney, Agent, or Firm—George O. Saile; Stephen B. Ackerman

(57) ABSTRACT

An accelerometer design is described. It operates by measuring a change in capacitance when one plate is fixed and one is mobile (free to accelerate). Unlike prior art designs where such changes are caused by variations in the plate separation distance, in the design of the present invention the plate separation distance is fixed, it being the effective plate area that changes with acceleration. A key feature is that the basic unit is a pair of capacitors. The fixed plates in each case are at the same relative height but the mobile plates are offset relative to the fixed plates, one mobile plate somewhat higher than its fixed plate with the other mobile plate being somewhat lower. Then, when the mobile plates move (in the same direction), one capacitor increases in value while the other decreases by the same amount. This differential design renders the device insensitive to sources of systematic error such as temperature changes. A process for manufacturing the design is described.

10 Claims, 4 Drawing Sheets

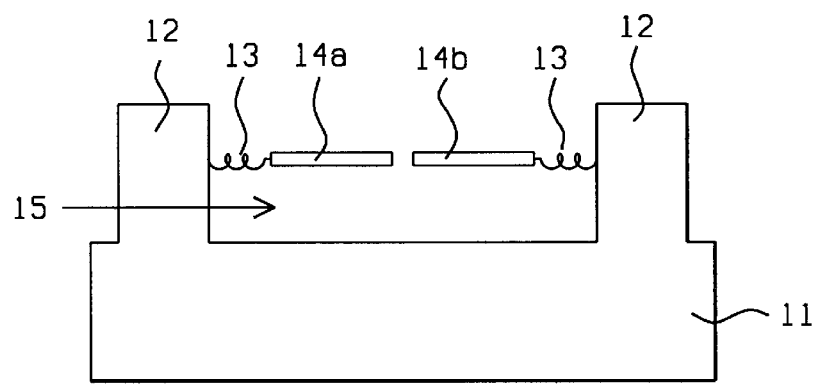
FIG. 1 – Prior Art
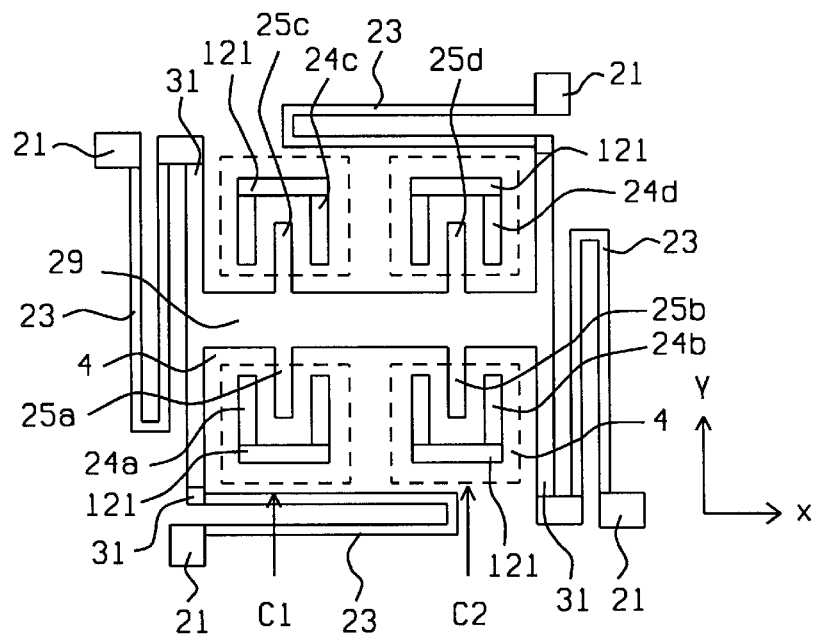
FIG. 2

Z-AXIS ACCELEROMETER

FIELD OF THE INVENTION

The invention relates to the general field of accelerometers with particular reference to Z-axis units and methods for their manufacture.

BACKGROUND OF THE INVENTION

Accelerometers have wide applications such as for inertial navigation systems, automotive safety, and missile control. Z-axis accelerometers can be used to control side air bags, vehicle control and multi-axis sensing systems. Normally, z-axis accelerometers are fabricated using bulk micromachined technology or stacked thin films. Such devices have large size and need double-side bonded three wafer processes. This can lead to stress control problems in the films which, in turn, causes sticking problems during release.

The basic principle underlying the operation of units of this type is schematically illustrated in FIG. 1. Two plates, 14a and 14b are attached by springs 13 to support posts 12 and their capacitance relative to the upper surface of substrate 11 is monitored. While the device accelerates in direction A, plates 14a and 14b are drawn closer to the upper surface of 11 and their mutual capacitance decreases in proportion to the rate of acceleration. Similarly, during acceleration in the −A direction, the capacitance increases.

The arrangement shown in FIG. 1 has the merit of providing a high level of sensitivity. However it has the serious limitation that it cannot distinguish capacitance changes due to acceleration from changes arising from other causes such as temperature, and other possible systematic errors. Since both capacitor plates respond to acceleration by moving in the same direction, a differential design in which the capacitance changes differently (preferably oppositely) for the two plates is not feasible.

A routine search of the prior art was performed. The following references of interest were found:

In U.S. Pat. No. 5,576,250, Diem et al. show how to fabricate off-set parallel plates for use in a sensor. The approach used is to form beams by etching and then filling trenches, said filling material then becoming the beam. MacDonald et al. (U.S. Pat. No. 5,770,465) show a trench fill masking technique while Andersson (U.S. Pat. No. 5,723,790) teaches an accelerometer with multiple cantilever beams free to move in specific directions, said motions being detected by means of piezoresistive sensors. Ishida et al. (U.S. Pat. No. 5,830,777) and Delapierre (U.S. Pat. No. 4,776,924) show other accelerometers processes.

SUMMARY OF THE INVENTION

It has been an object of the present invention to provide a Z-axis accelerometer design.

Another object of the invention has been to provide a process for manufacturing said accelerometer.

A further object has been that said accelerometer be insensitive to motion that arises from any cause other than acceleration (such as temperature changes).

These objects have been achieved by measuring a change in capacitance when one plate is fixed and one is mobile (free to accelerate). Unlike prior art designs where such changes are caused by variations in the plate separation distance, in the design of the present invention the plate separation distance is fixed, it being the effective plate area that changes with acceleration. A key feature is that the basic unit is a pair of capacitors. The fixed plates in each case are at the same relative height but the mobile plates are offset relative to the fixed plates, one mobile plate somewhat higher than its fixed plate with the other mobile plate being somewhat lower. Then, when the mobile plates move (in the same direction), one capacitor increases in value while the other decreases by the same amount. This differential design renders the device insensitive to sources of systematic error such as temperature changes. A process for manufacturing the design is described.

BRIEF DESCRIPTION OF THE DRAWINGS

FIG. 1 is an example of a Z-axis accelerometer of the prior art

FIG. 2 is a plan view of an embodiment of the structure of the present invention.

DESCRIPTION OF THE PREFERRED EMBODIMENTS

Figure 3:
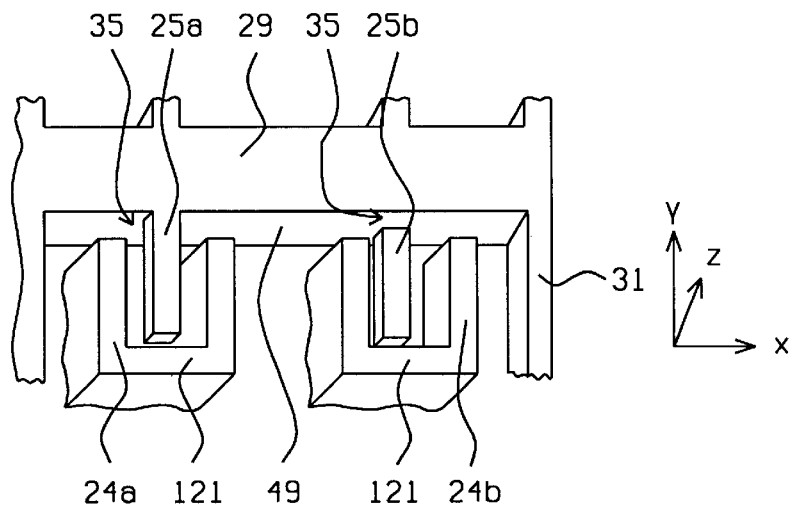
FIG. 3 is a cross-section through part of FIG. 2, illustrating a key feature of the invention.

The key feature of the present invention is that it provides a differential design wherein two closely located detectors respond to acceleration by changing their capacitances in opposite directions. If the capacitance of one decreases during acceleration then the capacitance of the other will increase, and vice versa.

A plan view of a specific embodiment is shown in FIG. 2. This will be used to explain the operating principles that the invention teaches, but it will be understood that other Z-axis accelerometers, different in appearance from the unit of FIG. 2, could be built through application of these same principles.

The mobile portion (inertial body) of the unit which has a total mass that is less than about $10^{-9}$–$10^{-7}$ Kg, is built around rectangular prism 29 that includes projections 31 that are attached to U-shaped springs 23. The latter are arranged so that two of them lie along the X direction and two lie along the Y direction. This ensures that movement of the inertial body in the X-Y plane is greatly restricted while leaving the body free to move along the Z-axis with little restraint. The particular spring design shown in FIG. 2 is our preferred design, but other designs that accomplish the same purpose are readily envisaged.

FIG. 2 shows, in plan view, four capacitors (each one enclosed by broken lines), the lower pair being marked as C1 and C2. Typically each capacitor has a capacitance of between about 0.1 and 10 pF. The capacitors have the form of comb structures which, in this example, comprise a mobile inside tooth 25 flanked by two fixed outside teeth 24. It will be understood that a wide range of similar structures could be substituted for the one shown here without departing from the spirit of the invention. The fixed plates are attached to the substrate at the areas marked as 121 while the springs are attached at 21, the entire structure shown in FIG. 2 being located within a cavity in the substrate (not explicitly shown but conceptually similar to cavity 15 in FIG. 1). This design results in a unit having a total thickness in the Z direction that is less than about 5 microns. Each capacitor plate has an area between about 300 and 3,000 sq. microns while the fixed and mobile plates are separated from each other by less than about 1 micron. This results in a device that is capable of measuring accelerations between about 1 g and 100 g to an accuracy between about 1 millig and 1 g (where g is the acceleration due to gravity).

Also shown in FIG. 2 are the top edges of the four mobile capacitor plates 25a, 25b, 25c, and 25d. These are attached to rectangular prism 29 along its long sides, two per side. This can be more clearly seen in FIG. 3 which is an isometric view of the part of 29 that includes mobile plates 25a and 25b. These can be seen to be attached to side surface 49 of 29. It is a key feature of the invention that 25a and 25b are narrower than the full thickness of side 49, by an offset amount 35. Thus 25a is flush with the upper surface of 29 but ends a distance 35 from the lower surface while 25b is flush with the lower surface of 29 but ends a distance 35 from the upper surface.

Figure 4:
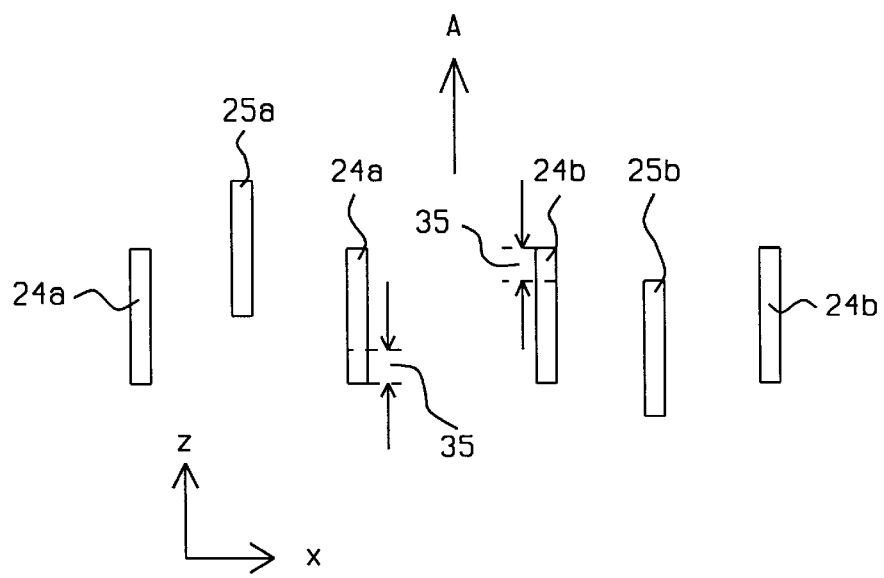
FIG. 4 is an isometric view of the general region that includes FIG. 2.

The reason for offsetting the two mobile plates can be understood by viewing FIG. 4 which is a schematic cross-section made at 4—4 in FIG. 2. The plates in FIG. 4 are being viewed head-on, i.e. in the Y direction. The fixed plates 24 are all at the same level (on the Z-axis) but the mobile plates 25 are seen to be offset by an amount 35, in opposite directions relative to the fixed plates. Thus, when the structure is given an acceleration A in Z-direction, both mobile plates will move downwards. Because of the two opposite offsets, the capacitance of capacitor C1 (a plates) will increase while the capacitance of capacitor C2 (b plates) will decrease by the same amount.

Since the capacitance changes on acceleration will always be equal and opposite, any situation in which the capacitances of both capacitors are found to simultaneously increase (or decrease) will be known to be due to systematic error such as dimensional changes due to temperature variations. Because of this feature, accelerometers designed according to the teachings of the present inventions have a low temperature dependence.

Figure 5:
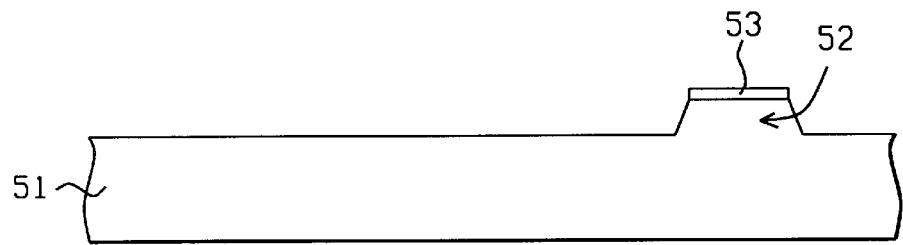
FIGS. 5–10 illustrate successive steps that make up the process of the present invention.
Figure 6:
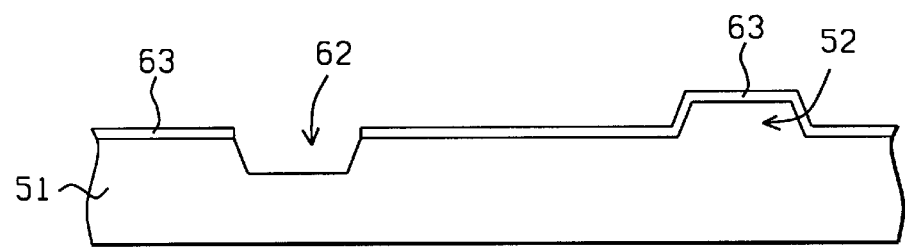

We now present a process for manufacturing the accelerometer described above. Referring now to FIG. 5, the manufacturing process begins with the provision of substrate 51 which is preferably of single crystal silicon, but other materials such as polysilicon could also have been used. On one side of 51 (arbitrarily chosen here to be the right side), pedestal 52 is formed by masking the surface with etch mask 53 and then etching. Depending on etch conditions, pedestal 52 may have vertical or sloping sidewalls. On the left side of 51 trench 62 is formed by masking the surface with etch mask 63 (as seen in FIG. 6) and then etching. Depending on etch conditions, trench 62 may have vertical or sloping sidewalls.

Figure 7:
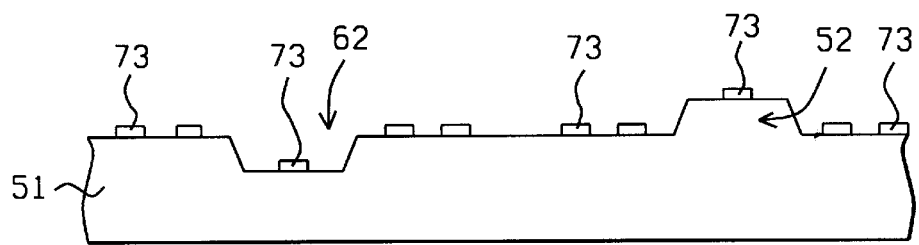

Next, as shown in FIG. 7, the surface is coated with protective layer 73 which is then patterned according to the shapes seen in FIG. 2 so as to define the mobile and immobile parts of the device, including springs 31. The patterning procedure ensures that left comb tooth 25a of capacitor C1 is located over trench 62 while teeth 24a are located to lie outside trench 62. Similarly, right comb tooth 25b of capacitor C2 is located over pedestal 52 while teeth 24b are located to lie outside pedestal 52

Figure 8:
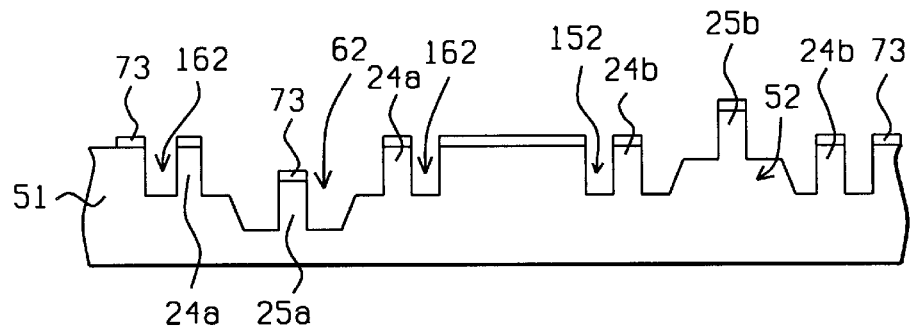

Referring now to FIG. 8, protective layer 73 is used as a mask while the substrate is etched. Our preferred material for layer 73 has been silicon oxide, but other materials (acting as hard masks) such as silicon nitride or selected metals could also have been used. This results in the formation of trench 162, which has vertical sidewalls, within which the original trench 62 now lies. In addition, pedestals 24a, which lie outside trench 62 and which will be connected to the immobile part of the structure, and pedestal 25a, which lies inside 62 and will be connected to the mobile part, are formed. Additionally, as a result of etching with layer 73 as mask, trench 152, having vertical sidewalls, is formed. The original pedestal 52 lies within trench 152. Pedestals 24b, which lie outside pedestal 52, and which will be connected to the immobile part of the structure, and pedestal 24a, which arises from the top of 52, and will be connected to the mobile part, are also formed.

Figure 9:
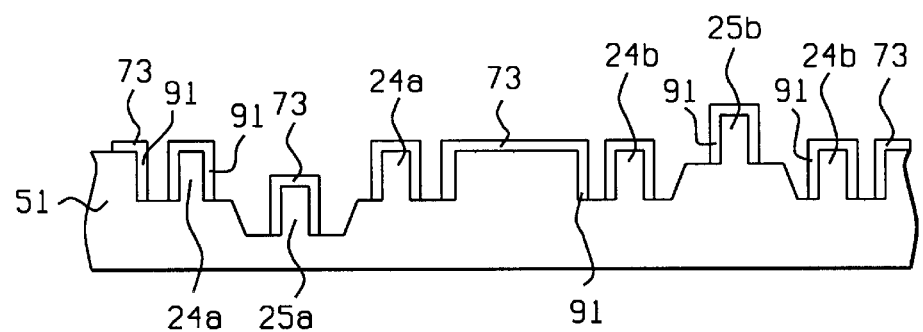
Figure 10:
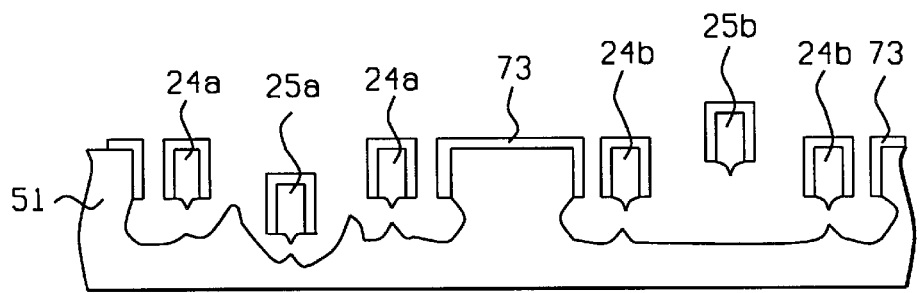

Referring now to FIG. 9, with mask layer 73 still in place, all vertical surfaces are selectively coated with second protective layer 91. Our preferred material for layer 91 has been silicon oxide but other materials such as silicon nitride or selected metals could also have been used. Then, as illustrated in FIG. 10, the substrate is isotropically etched until the mobile parts are released from direct contact with the substrate, remaining connected thereto only through springs 23 (see FIG. 2). Our preferred etchant for performing the isotropic etching has been a mix of sulfur hexafluoride ($SF_6$) and xenon difluoride ($XeF_2$). As result of this release etching step, the left and right comb structures are transformed into left and right capacitors such as C1 and C2 in FIG. 2. After the isotropic etching step, all protective layers (73 and 91) are removed. Performance problems could result if these layers are left in place.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a Z-axis accelerometer, having a mobile part and an immobile part, comprising:

providing a substrate having left and right areas;

within the right area, forming a first right pedestal that extends upwards from a first upper surface;

within the left area forming a first left trench that extends downwards from said first upper surface;

coating with a first protective layer and then patterning the protective layer to define the mobile and immobile parts, said parts being connected by a spring structure intended to inhibit movement of the mobile part in a plane parallel to said upper surface;

further patterning said first protective layer to define left and right comb structures, the left comb structure having at least one tooth located over the first left trench and connected to the mobile part, and at least one tooth located outside the first left trench and connected to the immobile part, the right comb structure having at least one tooth located over the first right pedestal and connected to the mobile part, and at least one tooth located outside the first right pedestal and connected to the immobile part;

using the protective layer as a mask, etching the substrate, thereby forming:

a second left trench within which lie the first left trench and at least two pedestals, one pedestal extending upwards from inside the first left trench and connected to the mobile part, and one pedestal extending upwards from outside the first left trench and connected to the immobile part, and a first right left trench within which lie the first right pedestal and at least two other pedestals, one of the other pedestals extending upwards from within the first right pedestal and connected to the mobile part, and one of the other pedestals extending upwards from outside the first right pedestal and connected to the immobile part;

with the protective layer in place, selectively coating all vertical surfaces with a second protective layer;

isotropically etching the substrate until the mobile part is released from direct contact with the substrate, remaining connected thereto only through said spring structure; and thereby transforming the left and right comb structures into left and right capacitors each having mobile and immobile plates, said mobile plates being limited by the springs to motion normal to the upper surface, whereby motion by both mobile plates, relative to the immobile plates, results in an increase in capacitance by one of the capacitors and a decrease in capacitance by the other capacitor.

2. The process recited in claim 1 wherein the first right pedestal has sloping sidewalls and a height of between about 1 and 5 microns.

3. The process recited in claim 1 wherein the first left trench has sloping sidewalls and a depth of between about 1 and 5 microns.

4. The process recited in claim 1 wherein the second left trench has vertical sidewalls and a depth of between about 3 and 30 microns.

5. The process recited in claim 1 wherein the first right trench has vertical sidewalls and a depth of between about 3 and 30 microns.

6. The process recited in claim 1 wherein the substrate is selected from the group consisting of monosilicon, polysilicon, and metals.

7. The process recited in claim 1 wherein the first protective layer is selected from the group consisting of silicon oxide, silicon nitride, and metals.

8. The process recited in claim 1 wherein the second protective layer is selected from the group consisting of silicon oxide, silicon nitride, and metals.

9. The process recited in claim 1 wherein the step of isotropic etching further comprises using a mix of $SF_6$ and $XeF_2$.

10. The process recited in claim 1 further comprising, after isotropic etching, removing all protective layers.

* * * * *